United States Patent [19]

Fukushi

[11] Patent Number: 4,893,274

[45] Date of Patent: Jan. 9, 1990

[54] SEMICONDUCTOR MEMORY DEVICE HAVING LEVEL CONVERTERS

[75] Inventor: Isao Fukushi, Yokohama, Japan

[73] Assignee: Fujutsu Limited, Kawasaki, Japan

[21] Appl. No.: 261,298

[22] Filed: Oct. 24, 1988

[30] Foreign Application Priority Data

Oct. 30, 1987 [JP] Japan .................................. 62-273481

[51] Int. Cl.[4] ............................................ G11C 13/00
[52] U.S. Cl. ............................ 365/189.04; 365/230.06
[58] Field of Search ...................... 365/189.01, 189.04, 365/189.05, 230.02, 230.06

[56] References Cited

U.S. PATENT DOCUMENTS

4,686,650 8/1987 Hori et al. ...................... 365/189.04

Primary Examiner—Terrell W. Fears
Attorney, Agent, or Firm—Armstrong, Nikaido, Marmelstein, Kubovcik & Murray

[57] ABSTRACT

A semiconductor memory device including a plurality of level converters, each of the level converters including a bridge circuit constituted by four MOS transistors having one type of conductivity, gates of one pair of four transistors opposing each other receiving a first signal and gates of the other pair of four transistors opposing each other receiving a signal complementary to the first signal; a pair of complementary MOS inverter circuits to which a second signal and a signal complementary to the second signal are input, respectively, the outputs of the pair of inverter circuits being connected to a first pair of connecting points positioned alternately in the bridge circuit, respectively; and a flip-flop circuit connected between a second pair of connecting points positioned alternately in the bridge circuit, to thereby output a third signal and a signal complementary to the third signal from the second pair of connecting points, resepctively.

5 Claims, 6 Drawing Sheets

SEMICONDUCTOR MEMORY DEVICE HAVING LEVEL CONVERTERS

BACKGROUND OF THE INVENTION (1) Field of the Invention

The present invention relates to a semiconductor memory device having a level converter. Particularly, the present invention relates to a semiconductor memory device having a level converter in which the potential levels of a pair of output signals complementary to each other supplied from the level converter are changed (i.e., inverted) in accordance with the potential level of the control signal supplied from the circuit for controlling an inversion or non-inversion of an address bit signal in accordance with data stored therein (e.g., a logic level of an address bit corresponding to a portion of a standard memory cell array having a defective memory cell thereamong).

(2) Description of the Related Art

Recently, in a semiconductor memory device comprising complementary MOS (CMOS) circuits, portions of the semiconductor memory device (e.g., address buffer circuits to which corresponding address bit signals are input) are constructed by a circuit comprising bipolar transistors (e.g., by a circuit including emitter coupled logic gates) to increase the operational speed of the memory device. This type of semiconductor memory device is generally called a "BiCMOS" memory device.

In this type of semiconductor memory device, level converters must be provided between the respective address buffer circuits including emitter coupled logic gates constituted by NPN type bipolar transistors and a decoder circuit constituted by MOS transistors, for example, to convert the logic amplitude (i.e., the potential difference between a high logic level and a low logic level) of the output signals supplied from each of the address buffer circuits to a value different from that of the above output signals (i.e., to a larger value needed for operating the decoder circuit constituted by MOS transistors).

Further, in this type of semiconductor memory device, control circuits are provided for controlling the inversion or non-inversion of a corresponding address bit signal in accordance with data stored therein (e.g., a logic level of corresponding address bit corresponding to a portion of a standard memory cell array having a defective memory cell therein).

Accordingly, a portion of the standard memory cell array corresponding to a predetermined address (e.g., a predetermined row address) is selected through the decoder circuit in accordance with the potential levels of the address bit signals supplied from each of the level converters, when at least one logic level of the input address bit signals does not coincide with that of the data stored in the corresponding control circuit. Further, a redundancy memory cell array is selected through a circuit for controlling a switch from the standard memory cell array to the redundancy memory cell array, instead of the portion of the standard memory cell array having the defective memory cell therein, when each logic level of the input address bit signals coincides with that of the data stored in the corresponding control circuit.

To attain the above-mentioned operation, in the conventional address buffer circuit used in this type of semiconductor memory device, the circuit configuration comprising emitter coupled logic gates connected in series is adopted, to which gates are input the corresponding address bit signal and the control signal supplied from the circuit for controlling the inversion or non-inversion of the address bit signal in accordance with data stored therein, so that the potential levels of a pair of signals output from the address buffer circuit may be changed (i.e., inverted) in accordance with the potential levels of the above address bit signal and the above control signal.

Nevertheless, in the address buffer circuit constituted by the emitter coupled logic gates connected in series, problems arise in that a margin for the power supply potential applied to the address buffer circuit is reduced, and thus it is impossible to obtain a sufficient logic amplitude (i.e., sufficient potential difference between the high and low logic levels) for the output signal supplied from the address buffer circuit, and further, the speed of operation of the level converters connected after the corresponding address buffer circuits is reduced.

SUMMARY OF THE INVENTION

The present invention is intended to solve the above problems, and therefore, the main object of the present invention is to increase the margin for the power supply potential applied to the address buffer circuit and to lower the low potential level of the output signal supplied from the address buffer circuit to the level converter, to thus increase the level conversion speed of the level converter, by constituting the level converter as a circuit wherein the inversion or non-inversion of the address bit signal based on the above control signal can be controlled within the level converter, and further, by enabling the address buffer circuit used in the memory device of this type to have a usual current switch configuration including only the emitter coupled logic gate to which the address bit signal and the reference signal are input.

To realize the above-mentioned object, according to the present invention, there is provided a semiconductor memory device having a plurality of level converters, each of the plurality of level converters comprising a bridge circuit constituted by four MOS transistors having one type of conductivity, gates of one pair of four transistors opposing each other receiving a first signal, and gates of the other pair of four transistors opposing each other receiving a signal complementary to the first signal; a pair of complementary MOS inverter circuits to which a second signal and a signal complementary to the second signal are input, respectively, the outputs of the pair of inverter circuits being connected to a first pair of connecting points positioned alternately in the bridge circuit, respectively; and a flip-flop circuit connected between a second pair of connecting points positioned alternately in the bridge circuit, thereby causing an output of a third signal and a signal complementary to the third signal from the second pair of connecting points, respectively.

According to the above construction, the potential levels of the first pair of connecting points are changed from a low level to a high level, and vice versa, (i.e., are inverted) in accordance with the potential levels of the second signal and the signal complementary to the second signal supplied to the pair of inverter circuits, respectively, and the above potential levels of the first pair of connecting points are output as the third signal and the signal complementary to the third signal, respectively, through the pair of four transistors turned-ON in accordance with the potential levels of the first signal and the signal complementary to the first signal.

BRIEF DESCRIPTION OF THE DRAWINGS

FIG. 1 comprised of FIGS. 1A and 1B is a diagram showing an example of the overall construction of the semiconductor memory device of this type;

DESCRIPTION OF THE PREFERRED EMBODIMENTS

Figures 1, 1A:
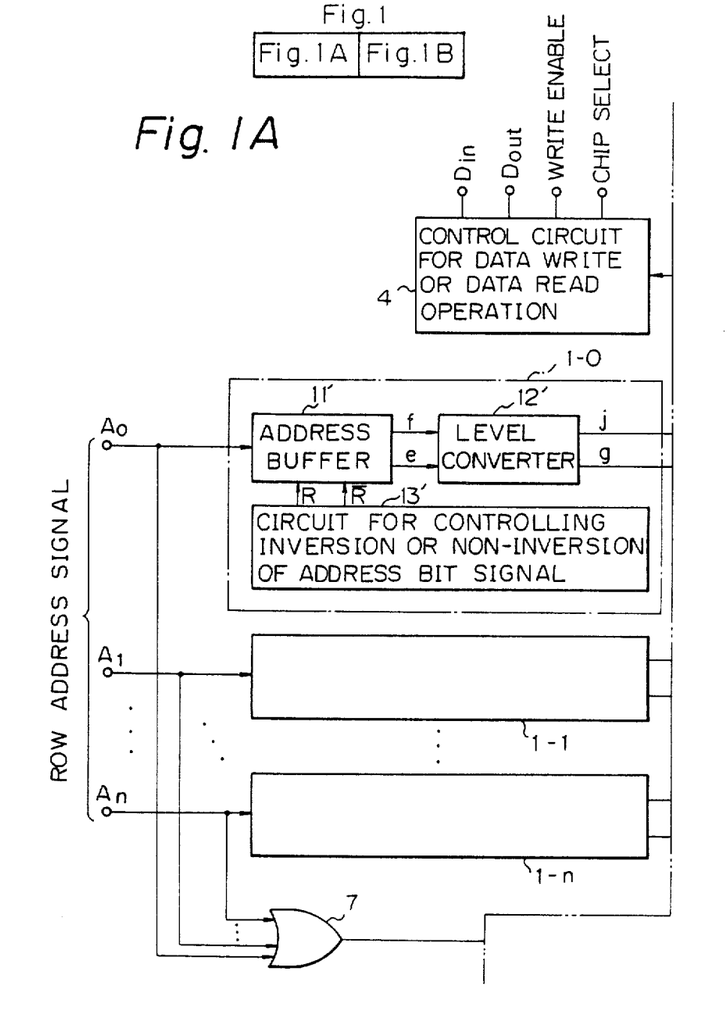
Figure 1B:
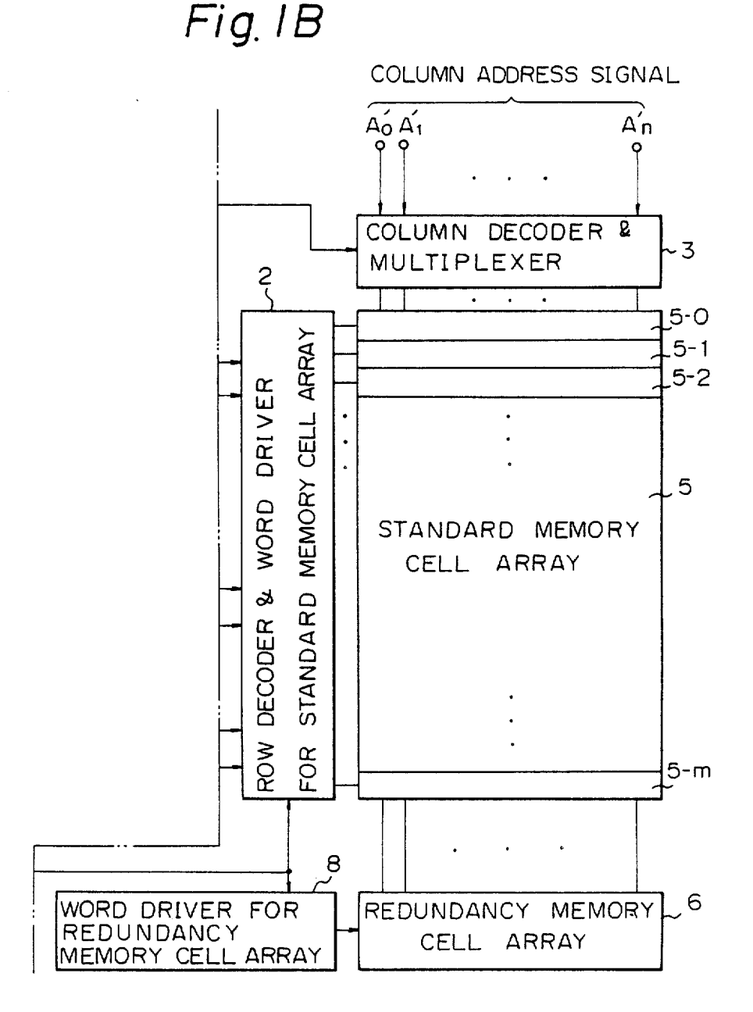

To clarify the background of the present invention, an example of the overall construction of this type of semiconductor memory device is shown schematically in FIG. 1.

In FIG. 1, reference numeral 11' shows an address buffer circuit to which a row address bit signal $A_0$ and a reference signal (not shown in FIG. 1) are input, and a signal e and a signal f complementary to the signal e having predetermined potential levels, respectively, are output from the circuit 11, in accordance with the potential level of the input address bit signal $A_0$. Reference numeral 13' is a circuit for controlling the inversion or non-inversion of the address bit signal, and a signal R and a signal $\bar{R}$ complementary to the signal R and having predetermined potential levels, respectively, are output from the circuit 13' in accordance with data stored in the above circuit 13' (e.g., a logic level of a row address bit corresponding to a portion of a standard memory cell array which includes a defective memory cell therein). The potential levels of the above signals e and f are changed (i.e., are inverted) in accordance with not only the potential level of the input address bit signal $A_0$, but also the potential levels of the above signals R and $\bar{R}$. The address buffer circuit 11' is generally constituted by emitter coupled logic gates (i.e., an ECL circuit construction formed by NPN type bipolar transistors) connected in series, and thus the logic amplitude (i.e., the potential difference between the high logic level and low logic level) of the signals e and f output from the address buffer circuit 11' is made a predetermined value determined by the above ECL circuit construction connected in series.

Reference numeral 12' denotes a level converter to which the above signals e and f are input from the circuit 11' and a signal j and a signal g complementary to the signal j are supplied from the level converter 12' to a row decoder 2. In this connection, the level converter 12' converts the logic amplitude (i.e., the potential difference between the high logic level and low logic level) of the above signals j and g to a value different from that of the above signals e and f (i.e., to the larger value needed for operating a row decoder which is generally constituted by MOS transistors).

As shown in FIG. 1, a portion 1-0 enclosed by a dot-dash line includes the above circuits 11', 13', and the level converter 12', and portions 1-1 to 1-n to which address bit signals $A_1$ to $A_n$ are input, respectively, have a construction similar to that of the portion 1-0. The signals output from each of the level converters provided in the portions 1-1 to 1-n (corresponding to the signals j and g output from the portion 1-0) are also supplied to the row decoder 2 to which a word driver for the standard memory cell array is connected.

A standard memory cell array 5 is constituted by predetermined number of portions of the standard memory cell array 5-0 to 5-m, which have separate row addresses allocated thereto, respectively. Also, a redundancy memory cell array 6 is provided and can be selected through a word driver 8 for the redundancy memory cell array instead of a portion of the standard memory cell array which includes a defective memory cell.

Accordingly, a portion of the standard memory cell array corresponding to a predetermined row address (e.g., 5-0) is selected through the row decoder and the word driver 2 for the standard memory cell array in accordance with the potential levels of the row address bit signals supplied from each of the above level converters, when at least one logic level of the input row address bit signals $A_0$ to $A_n$ does not coincide with that of the data stored in the corresponding circuit 13'. Further, the redundancy memory cell array 6 is selected through a circuit 7 (in this case, an OR gate 7) for controlling a switch from the standard memory cell array to the redundancy memory cell array and the word driver 8 for the redundancy memory cell array, instead of the portion of the standard memory cell array which includes a defective memory cell when each logic level of the input address bit signals $A_0$ to $A_n$ coincides with that of the data stored in the corresponding circuit 13'.

For example, where the input row address bit signals are constituted by $A_0$ to $A_3$ and a portion of the standard memory cell array corresponding to row address "0, 1, 1, 0" includes the defective memory cell, and further, the second and third address bit signals $A_1$ and $A_2$ among the above address bit signals $A_0$ to $A_3$ are inverted by the data stored in the above control circuit 13' provided in the corresponding portion (i.e., 1-1 and 1-2), then if each of the row address bit signals "0, 1, 1, 0" is input from an external source to the corresponding address buffer circuit, the row address bit signals supplied from the respective portions 1-0 to 1-3 to the row decoder 2 become "0, 0, 0, 0" due to the inversion of the second and third address bit signals $A_1$ and $A_2$. Accordingly, the portion of the standard memory cell array corresponding to the row address "0, 0, 0, 0" is selected through the row decoder 2.

On the other hand, if each of the row address bit signals "0, 0, 0, 0" is input from the external source to the corresponding address buffer circuit, the row address bit signals supplied from the respective portions 1-0 to 1-3 to the row decoder 2 become "0, 1, 1, 0" (i.e., the row address corresponding to the portion of the standard memory cell array including the defective memory cell), due to the above inversion of the signals $A_1$ and $A_2$. But, in this case, the output potential of the control circuit 7 (i.e., the OR gate 7) to which each of the address bit signals "0, 0, 0, 0" is input becomes low level, and therefore, the redundancy memory cell array 6 is selected through the word driver 8, and simultaneously, the portion of the standard memory cell array including the above defective memory cell is not selected due to the supply of the above low level signal output from the control circuit 7 to the row decoder 2.

Also, in FIG. 1, reference numeral 3 denotes a column decoder having a multiplexer provided therein. Column address bit signals $A_0'$ to $A_n'$ are input from the external source to the column decoder 3, and a predetermined memory cell provided in the portion of the standard memory cell array (e.g., 5-0) selected through the row decoder and word driver 2 or provided in the redundancy memory cell array 6 is selected for writing data $D_{in}$ to the above selected memory cell or reading data $D_{out}$ from the above selected memory cell, in accordance with the potential levels of the input column address bit signals $A_0'$ to $A_n'$. In this connection, a control circuit 4 for a data write or data read operation is provided to cause the multiplexer to select the data write operation of the data $D_{in}$ for the selected memory cell and the data read operation of the data $D_{out}$ from the selected memory cell. Also, a write enable signal and a chip select signal and so on, are generally supplied from th external source to the above control circuit 4.

In the above FIG. 1, portions 1-0 to 1-n each including the address buffer circuit 11,, the above control circuit 13', and the level converter 12', are provided to supply row address bit signals having predetermined potential levels from the external source to the row decoder 2, and portions similar to those above-mentioned can be provided to supply predetermined column address bit signals from the external source to the column decoder 3.

Figure 2A:
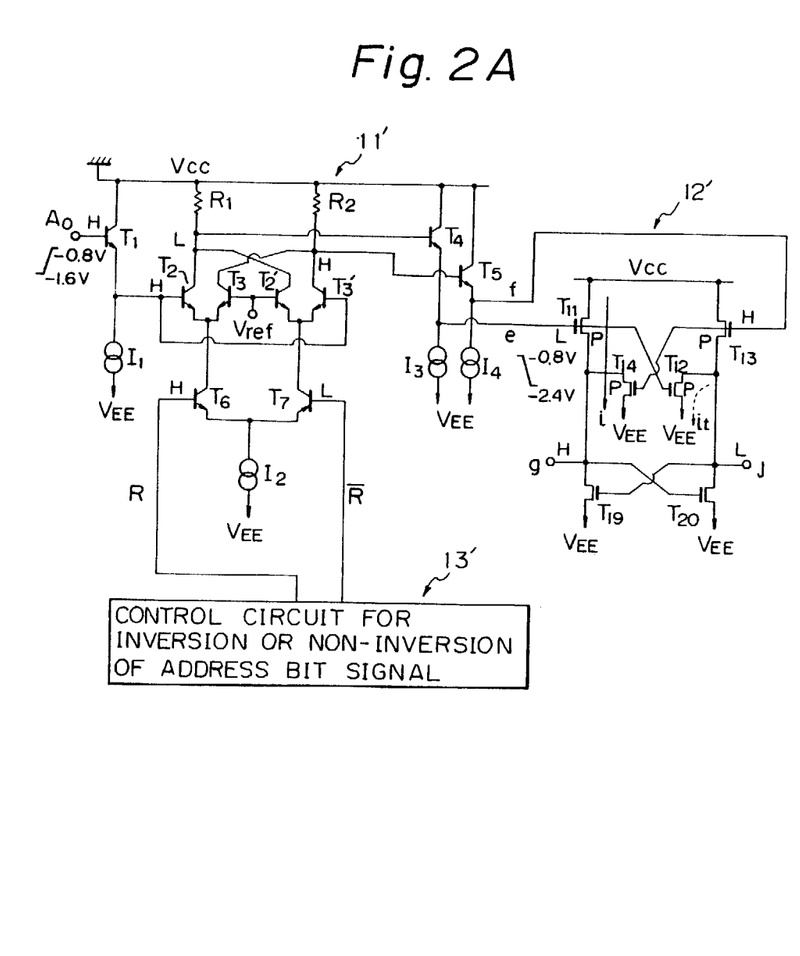
FIGS. 2A and 2B are circuit diagrams illustrating an example of a conventional circuit corresponding to a portion 1-0 shown in FIG. 1.
Figure 2B:
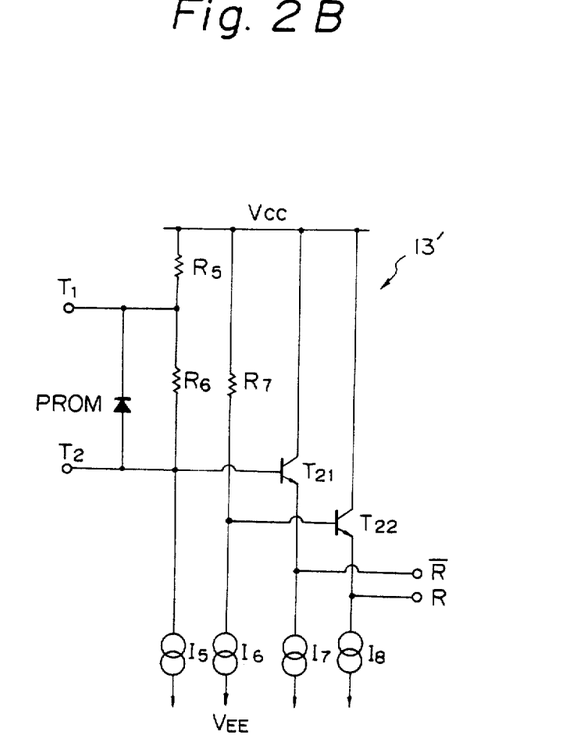

FIGS. 2A and 2B are circuit diagrams illustrating an example of a conventional circuit corresponding to a portion 1-0 shown in FIG. 1.

In the address buffer circuit 11' shown in FIG. 2A, reference characters $T_1$, $T_2$, $T_2'$, $T_3$, $T_3'$, and $T_4$ to $T_7$ are NPN type bipolar transistors, reference characters $R_1$ and $R_2$ are resistors, and reference characters $I_1$ to $I_4$ are constant current sources.

The emitters of a pair of transistors $T_2$ and $T_3$ and the emitters of a pair of transistors $T_2'$ and $T_3'$ are connected in common, and thus two emitter coupled logic gates (ECL gates) are constituted by each of the pair of transistors $T_2$ and $T_3$ and $T_2'$ and $T_3'$. The address bit signal $A_0$ is input to the base of the transistor $T_1$, and accordingly, the potential of the emitter of the transistor $T_1$ is supplied to the bases of the transistors $T_2$ and $T_3'$, respectively. Further, the potential of the reference signal $V_{ref}$ is supplied to the bases of the transistors $T_3$ and $T_2'$, respectively.

Furthermore, the emitters of a pair of transistors $T_6$ and $T_7$ are connected in common, and the collectors of the transistors $T_6$ and $T_7$ are connected to the connecting points of the emitters of the above transistors $T_2$ and $T_3$ and $T_2'$ and $T_3'$, respectively. Therefore, the ECL gate constituted by the transistors $T_6$ and $T_7$ is connected in series to the above two ECL gates constituted by the transistors $T_2$ and $T_3$ and $T_2'$ and $T_3'$. The signal R and the signal $\overline{R}$ complementary to the signal R are supplied from the circuit 13' for controlling the inversion or non-inversion of the address bit signal, to the bases of the transistors $T_6$ and $T_7$, respectively. Reference symbols $V_{CC}$ and $V_{EE}$ indicate high level side and low level side power source potentials, respectively.

In the above address buffer circuit 11', when the address bit signal $A_0$ having a high potential (e.g., $-0.8$ volts) is input to the base of the transistor $T_1$, a predetermined high potential based on the above address bit signal $A_0$ is supplied to the bases of the transistors $T_2$ and $T_3'$, as indicated by symbols "H". Also, the potential of the reference signal $V_{ref}$ is supplied to the bases of the transistors $T_3$ and $T_2'$, as above-mentioned, and thus the transistors $T_2$ and $T_3'$ are turned-ON but the transistors $T_3$ and $T_2'$ are turned-OFF.

Further, if it is assumed that the potentials of the above signals R and $\overline{R}$ output from the circuit 13' in accordance with the data stored in the circuit 13' are high and low, as indicated by symbols "H" and "L", respectively, the transistor $T_6$ is turned-ON and the transistor $T_7$ is turned-OFF.

Accordingly, a predetermined current flows from $V_{CC}$ to $V_{EE}$ through the resistor $R_1$, the turned-ON transistors $T_2$ and $T_6$ connected in series, and the constant current source $I_2$, and as a result, the base potential of the transistor $T_4$ becomes low level due to the potential drop produced through the resistor $R_1$, and accordingly, the emitter potential of the transistor $T_4$ (i.e., the potential of the signal e) becomes low level (i.e., $-2.4$ volts). On the other hand, the base potential of the transistor $T_5$ is maintained at a high level (in this case, 0 volt) due to the cut-OFF of the transistors $T_3$ and $T_7$, and thus the emitter potential of the transistor $T_5$ (i.e., the potential of the signal f) becomes high level (i.e., $-0.8$ volts).

In this connection, when the potential of the above address bit signal $A_0$ is low (e.g., $-1.6$ volts), the transistors $T_3$ and $T_2'$ are turned-ON but the transistors $T_2$ and $T_3'$ are turned-OFF. Also, if it is assumed that the potentials of the signals R and $\overline{R}$ are low and high in accordance with the data stored in the circuit 13', respectively, the transistor $T_6$ is turned-OFF and the transistor $T_7$ is turned-ON.

Therefore, the potentials of the above signals e and f output from the address buffer circuit 11' are changed from low level to high level, and vice versa, (i.e., inverted) in accordance with not only the potential level of the input address bit signal $A_0$ but also the potential levels of the signals R and $\overline{R}$ supplied from the circuit 13'.

The signals e and f output from the address buffer circuit 11' are then supplied to the level converter 12', in which a predetermined logic amplitude (in this case, $[-0.8-(-2.4)]=1.6$ volts) of the signals e and f complementary to each other is converted to the larger value needed for operating a decoder circuit constituted by MOS transistors.

Figure 4A:
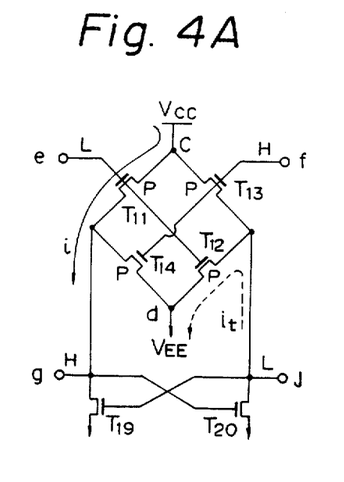
FIGS. 4A and 4B are circuit diagrams explaining how the equivalent circuit of the circuit shown in FIG. 3 is changed in accordance with the potential level of the control signal supplied from the circuit for controlling the inversion or non-inversion of the address bit signal.

The level converter 12' comprises four P channel type MOS transistors $T_{11}$ to $T_{14}$, as indicated by symbols "P", and a flip-flop circuit constituted by two N channel type MOS transistors $T_{19}$ and $T_{20}$. In this connection, the above four transistors $T_{11}$ to $T_{14}$ are successively connected so that a bridge circuit as shown in FIG. 4A is constituted. The signal e is supplied to grates of a pair of MOS transistors $T_{11}$ and $T_{12}$ (i.e., a pair of opposing MOS transistors in the above bridge circuit), and the signal f is supplied to gates of the other pair of MOS transistors $T_{13}$ and $T_{14}$ (i.e., the other pair of opposing MOS transistors in the above bridge circuit).

Accordingly, when the potentials of the above signals e and f are low and high, as indicated by symbols "L" and "H", respectively, the P channel type MOS transistors $T_{11}$ and $T_{12}$ are turned-ON and the other pair of transistors $T_{13}$ and $T_{14}$ are turned-OFF.

Therefore, the potential of the connecting point of the transistors $T_{11}$ and $T_{19}$ is pulled up to $V_{CC}$ level (e.g., 0 volt) by a charging current i flowing through the turned-ON transistor $T_{11}$ and the stray capacity, and conversely, the potential of the connecting point of the transistors $T_{13}$ and $T_{20}$ is pulled down to $V_{EE}$ level (e.g., $-5.2$ volts) by a discharging current $i_r$ flowing from the charged stray capacity through the turned-ON transistor $T_{12}$. As a result, the N channel type MOS transistors $T_{19}$ and $T_{20}$ constituting the flip-flop circuit are turned-OFF and turned-ON, respectively, and thus the above pulled-up and pulled-down potentials of the respective connecting points are latched as they are. Accordingly, the potential of the signal g output from the connecting point of the transistors $T_{11}$ and $T_{19}$ is maintained at a high level (e.g., 0 volt), the potential of the signal j output from the connecting point of the transistors $T_{13}$ and $T_{20}$ is maintained at a low level (e.g., $-5.2$ volts), and the above signal g and the signal j complementary to the signal g are supplied from the level converter to the decoder circuit constituted by MOS transistors.

In the above case, it is assumed that the potentials of the signals c and f are low and high, respectively. But when the potentials of the signals e and f are high and low, respectively, the pair of transistors $T_{13}$ and $T_{14}$ are turned-ON, and conversely, the pair of transistors $T_{11}$ and $T_{12}$ are turned-OFF, and thus the transistors $T_{19}$ and $T_{20}$ are turned-ON and turned-OFF, respectively. Accordingly, the potentials of the signals g and j are changed to low level and high level, respectively.

Namely, the potentials of the signals g and j output from the level converter 12' are changed (i.e., inverted) in accordance with not only the potential level of the input address bit signal $A_0$ but also the potential levels of the signals R and $\bar{R}$ supplied from the circuit 13'.

FIG. 2B is a circuit diagram illustrating an example of the above circuit 13' for supplying the signals R and $\bar{R}$ to the bases of the pair of bipolar transistors $T_6$ and $T_7$.

In the circuit 13' shown in FIG. 2B, reference symbol PROM is a diode for programming predetermined data, and is generally constituted from a bipolar transistor. Although the circuit including the PROM is usually open, if a predetermined potential is applied through the terminals (pads) $T_1$ and $T_2$ and a current having a predetermined value flows against the PN junction formed in the diode, the PN junction is caused to self-destruct, and as a result, a short-circuit is formed between the terminals $T_1$ and $T_2$, and thus predetermined data is programmed.

When the circuit including the PROM is open (i.e., when the above short-circuit is not formed between the resistor $R_6$), the potential drop due to the current flowing through the resistors $R_5$ and $R_6$ is made larger than that due to the current flowing through the resistor $R_7$, and thus the potential supplied to the base of the bipolar transistor $T_{21}$ is made lower than that supplied to the base of the bipolar transistor $T_{22}$. Accordingly, the potential of the signal $\bar{R}$ output from the emitter of the transistor $T_{21}$ becomes low level, but the potential of the signal R output from the emitter of the transistor $T_{22}$ becomes high level.

Conversely, when the above short-circuit is formed by the destruction of the above PN junction of the PROM (i.e., when the short-circuit is formed in parallel with the resistor $R_6$), the potential drop due to the current flowing through the resistor $R_5$ is made smaller than that due to the current flowing through the resistor $R_7$, and thus the potential supplied to the base of the transistor $T_{21}$ is made higher than that supplied to the base of the transistor $T_{22}$. Accordingly, the potential of the signal $\bar{R}$ output from the emitter of the transistor $T_{21}$ becomes high level but the potential of the signal R output from the emitter of the transistor $T_{22}$ becomes low level. In this connection, reference characters $I_5$ to $I_8$ show constant current sources.

Therefore, the potentials of the signals R and $\bar{R}$ output from the circuit 13' are changed (i.e., inverted) in accordance with data programmed in the PROM.

As above-mentioned, in the above conventional circuit as shown in FIG. 2A, a circuit configuration constituted by emitter coupled logic gates connected in series and to which both the corresponding address bit signal and the signals R and $\bar{R}$ corresponding to a data stored in the PROM provided in the circuit 13' are input, respectively, is adopted as the address buffer circuit. But, in an address buffer circuit constituted by the emitter coupled logic gates connected in series, problems arise in that a margin for the power supply potential applied to the address buffer circuit is reduced, and thus it is impossible to obtain a sufficient logic amplitude (i.e., a sufficient potential difference between high and low levels) for the signals output from the address buffer circuit, and accordingly, the speed of the operation of the level converter connected after the address buffer circuit is reduced.

The present invention has been created to solve the above problems, and the main object of the present invention is to increase the margin for the power supply potential applied to the address buffer circuit and to lower the low potential level of the signals supplied from the address buffer circuit to the level converter (e.g., to lower this level from ($-2.4$ volts) as shown in the above conventional circuit to, for example, ($-3.2$) volts), and thus to increase the level conversion speed of the level converter by constituting the level converter as a circuit configuration such that the inversion or non-inversion of the address bit signal based on the above signals R and $\bar{R}$ can be controlled within the level converter, and accordingly, the address buffer circuit can be constructed as a usual current switch including only the emitter coupled logic gate to which the address bit signal is input (i.e., not including the emitter coupled logic gate to which the above signals R and $\bar{R}$ are input).

Figure 3:
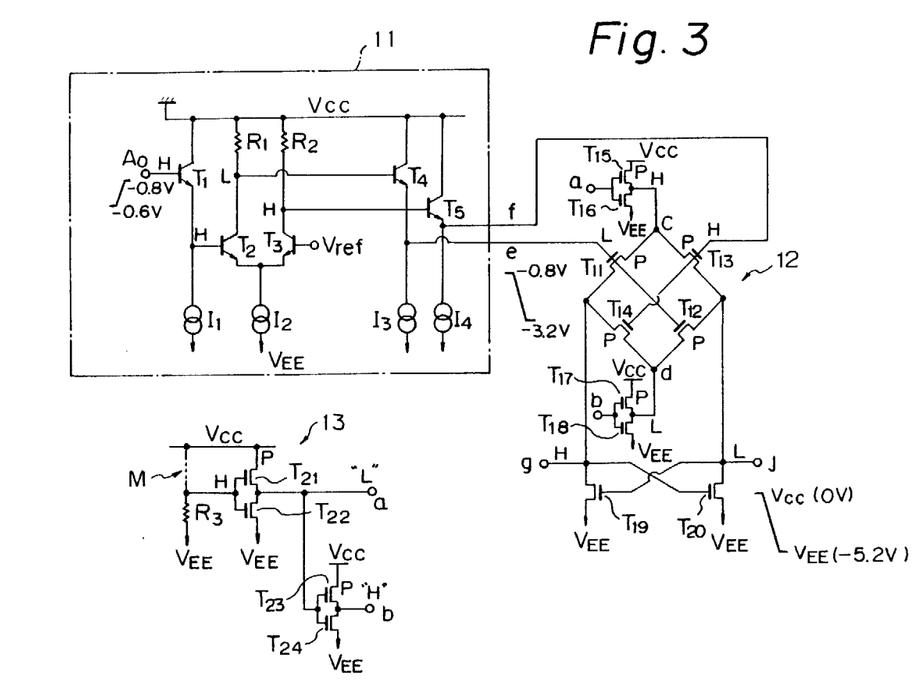
FIG. 3 is a circuit diagram illustrating an embodiment of the circuit corresponding to the above portion 1-0 according to the present invention.

FIG. 3 is a circuit diagram illustrating an embodiment of the circuit corresponding to the above portion 1-0, according to the present invention. The same reference numerals or characters as in FIG. 2A are given to each of the corresponding circuit portions shown in FIG. 3.

In FIG. 3, reference numeral 11 shows an ECL type address buffer circuit constituted as a usual current switch to which the address bit signal $A_0$ and the reference signal $V_{ref}$ are input. Reference numeral 13 is a circuit for controlling the inversion or non-inversion of the address bit signal in accordance with data stored in the above circuit 13 (e.g., the logic level of a row address bit corresponding to a portion of a standard memory cell array, which includes a defective memory cell therein). The control signals output from terminals a and b of the circuit 13, which signals are complementary to each other, are supplied to input terminals a and b of complementary MOS inverter circuits, as mentioned below, respectively.

Reference numeral 12 shows a level converter according to the present invention. The level converter 12 comprises P channel type MOS transistors $T_{11}$ to $T_{14}$ constituting the bridge circuit and N channel type MOS transistors $T_{19}$ and $T_{20}$ constituting the flip-flop circuit as shown in FIG. 2A, and a pair of complementary MOS (CMOS) inverter circuits for supplying the power source potential $V_{CC}$ or $V_{EE}$ to a connection point c (i.e., the connection point between the transistors $T_{11}$ and $T_{13}$) and a connection point d (i.e., the connection point between the transistors $T_{12}$ and $T_{14}$) in the bridge circuit, respectively, in accordance with the potential levels of the control signals supplied from the above circuit 13. Namely, one of the above CMOS inverter circuits comprises a P channel type MOS transistor $T_{15}$ and a N channel type MOS transistor $T_{16}$, each having a gate to which the control signal is supplied from the terminal a of the circuit 13, and supplies the power source potentials $V_{CC}$ or $V_{EE}$ to the connecting point c in accordance with the potential level of the control signal supplied from the terminal a. The other CMOS inverter circuit comprises a P channel type MOS transistor $T_{17}$ and an N channel type MOS transistor $T_{18}$ each having a gate to which the control signal is supplied from the terminal b of the circuit 13, supplies the power source potentials $V_{CC}$ or $V_{EE}$ to the connecting point d in accordance with the potential level of the control signal supplied from the terminal b. As shown in FIG. 3, the connecting points c and d are positioned alternately among four connecting points provided in the bridge circuit constituted by the transistors $T_{11}$ to $T_{14}$.

Figure 4B:
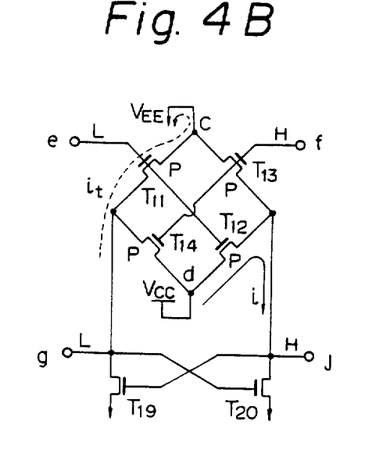

In this connection, the size of each of the transistors $T_{15}$ to $T_{18}$ constituting the above CMOS inverter circuits is large enough that the resistance value when turned-ON can be neglected. As a result, a circuit can be realized whereby the power source potentials $V_{CC}$ and $V_{EE}$ are substantially directly supplied to the connecting points c and d, respectively (as shown in FIG. 4A), or the power source potentials $V_{EE}$ and $V_{CC}$ are substantially directly supplied to the connecting points c and d, respectively (as shown in FIG. 4B), in accordance with the potential levels of the control signals supplied from the input terminals a and b of the CMOS inverter circuits. Namely, the power source potentials applied to the connecting points c and d may be changed from $V_{CC}$ to $V_{EE}$, and vice versa, in accordance with the potential levels of the control signals supplied from the input terminals a and b of the CMOS inverter circuits, as shown in FIG. 4A and FIG. 4B.

The circuit 13 for controlling the inversion or non-inversion of the address bit signal comprises a data storing portion (ROM portion) M constituted by, for example, a polysilicon layer which may be disconnected by laser, a fuse which may be disconnected by a predetermined current, or the above PROM constituted by a diode. The data (e.g., the logic level of a row address bit corresponding to a portion of a standard memory cell array which includes a defective memory cell) is stored in the portion M by selecting whether the circuit including the portion M is connected or disconnected.

Therefore, where the circuit including the ROM portion M is connected, the potential level of the connecting point between a resistor $R_3$ and gates of the P channel type MOS transistor $T_{21}$ and N channel type MOS transistor $T_{22}$ is made high level, and thus the transistor $T_{21}$ is turned-OFF and the transistor $T_{22}$ is turned-ON. As a result, the potential of the control signal output from the terminal a is inverted to a low level, as indicated by the symbol "L", and the low level signal is supplied to gates of the P channel type MOS transistor $T_{23}$ and N channel type MOS transistor $T_{24}$, and thus the transistor $T_{23}$ is turned-ON and the transistor $T_{24}$ is turned-OFF. As a result, the potential of the control signal output from the terminal b is again inverted to a high level, as indicated by the symbol "H".

Accordingly, in the level converter 12, the P channel type transistor $T_{15}$ is turned-ON by the above low level signal supplied from the terminal a, and thus the high level potential $V_{CC}$ is supplied through the turned-ON transistor $T_{15}$ to the connecting point c. Also, the N channel type transistor $T_{18}$ is turned-ON by the above high level signal supplied from the terminal b, and accordingly, the low level potential $V_{EE}$ is supplied through the turned-ON transistor $T_{18}$ to the connecting point d, and thus the circuit configuration of the level converter 12 is equivalent to that shown in FIG. 4A.

Under the above conditions, if the potential level of the address bit signal $A_0$ supplied to the base of the NPN transistor $T_1$ is high (e.g., $-0.8$ volts), the transistor $T_2$ connected at the base to the emitter of the transistor $T_1$ is turned-ON, and the transistor $T_3$, to the base of which the reference signal $V_{ref}$ is supplied, is turned-OFF. As a result, the base potential of the transistor $T_4$ becomes low level due to the voltage drop produced between the resistor $R_1$, and thus the potential level of the signal e supplied from the emitter of the transistor $T_4$ to the gates of a pair of MOS transistor $T_{11}$ and $T_{12}$ becomes low level (e.g., $-3.2$ volts). On the other hand, the base potential of the transistor $T_5$ becomes high level ($V_{CC}$ level), and thus the potential level of the signal f supplied from the emitter of the transistor $T_5$ to the gates of the other pair of MOS transistors $T_{13}$ and $T_{14}$ becomes high level (e.g., $-0.8$ volts).

As a result, the pair of MOS transistors $T_{11}$ and $T_{12}$ are turned-ON but the other pair of MOS transistors $T_{13}$ and $T_{14}$ are turned-OFF. Therefore, the potential level of the signal g output from the connecting point between the turned-ON transistor $T_{11}$ and turned-OFF transistor $T_{19}$ becomes high level ($V_{CC}$ level, e.g., 0 volt), and the potential level of the signal j output from the connecting point between the turned-ON transistors $T_{12}$ and $T_{20}$ becomes low level ($V_{EE}$ level, e.g., $-5.2$ volts). These signals g and j are then supplied from the level converter to the decoder circuit constituted by MOS transistors.

In this connection, if the potential level of the address bit signal $A_0$ supplied to the base of the transistor $T_1$ is low (e.g., $-1.6$ volts) the transistor $T_2$ is turned-OFF and the transistor $T_3$ is turned-ON, and as a result, the potential level of the signal e becomes high level but the potential level of the signal f becomes low level. Accordingly, the pair of MOS transistors $T_{11}$ and $T_{12}$ are turned-OFF but the other pair of MOS transistors $T_{13}$ and $T_{14}$ are turned-ON, and thus the potential levels of the signals g and j become low and high, respectively. Namely, the potential levels of the signals g and i output from the level converter are changed (i.e., inverted) in accordance with the potential level of the address bit signal supplied through the address buffer circuit to the level converter.

Also, where the circuit including the ROM portion M is disconnected, the potential levels of the control signals supplied from the terminals a and b become high and low, respectively.

Accordingly, in the level converter 12, the N channel type transistor $T_{16}$ is turned-ON by the above high level signal supplied from the terminal a, and thus the low level potential $V_{EE}$ is supplied through the turned-ON transistor $T_{16}$ to the connecting point c. Also, the P channel type transistor $T_{17}$ is turned-ON by the above low level signal supplied from the terminal b, and thus the high level potential $V_{CC}$ is supplied through the turned-ON transistor $T_{17}$ to the connecting point d. Accordingly, the circuit configuration of the level converter 12 becomes equivalent to that shown in FIG. 4B.

Therefore, even if the potential level of the address bit signal $A_0$ supplied to the base of the transistor $T_1$ is high and the pair of MOS transistors $T_{11}$ and $T_{12}$ are turned-ON due to the low potential level of the signal e, the potential level of the signal g becomes low level ($V_{EE}$ level) and the potential level of the signal j becomes high level ($V_{CC}$ level), as shown in FIG. 4B.

Therefore, the potential levels of the signals g and j output from the level converter are also changed (i.e., inverted), as shown in FIG. 4A and FIG. 4B, in accordance with the potential levels of the control signals supplied from the above circuit 13 to the level converter.

In this connection, in FIGS. 4A and 4B, reference symbol i corresponds to the charging current as described in FIG. 2A, and the flip-flop circuit comprising the N channel transistors $T_{19}$ and $T_{20}$ is driven by the above charging current. Also, reference symbol it corresponds to the discharge current described in FIG. 2A, and the potential of the corresponding portion may be rapidly pulled down by the above discharge current.

As above-mentioned, by using the level converter 12 according to the present invention, the potential levels of the signals output from the level converter 12 may be changed (i.e., inverted) within the level converter 12, in accordance with the potential levels of the control signals supplied from the circuit 13 for controlling an inversion or non-inversion of the address bit signal according to the data stored therein.

Namely, by using the level converter 12 according to the present invention, it is not necessary to provide the address buffer circuit including the emitter coupled logic gates connected in series, to which gates both the address bit signal and the control signals R and $\bar{R}$ output from the circuit 13' are supplied, as shown in FIG. 2A. Therefore, the address buffer circuit 11 connected to the level converter 12 according to the present invention may be constructed as a usual current switch to which only the address bit signal and the reference signal are input.

Although, in the above embodiment, P channel type MOS transistors $T_{11}$ and $T_{14}$ and N channel type MOS transistors $T_{19}$ and $T_{20}$ are adopted as the four MOS transistors consisting the bridge circuit and two MOS transistors constituting the flip-flop circuit, respectively, it is also possible to use N channel type MOS transistors $T_{11}$ to $T_{14}$ and P channel type MOS transistors $T_{19}$ and $T_{20}$, if the address buffer circuit is constituted by PNP type bipolar transistors instead of NPN type bipolar transistors constituting ECL gates as shown in FIG. 3.

As above-mentioned, according to the present invention, it is possible to increase the margin for the power supply potential applied to the address buffer circuit and to increase the logic amplitude (i.e., the potential difference between high level and low level) of the signals supplied from the address buffer circuit to the level converter (e.g., to lower the low potential level to ($-3.2$) volts), and thus obtain a high operational speed of the level converter.

I claim:

1. A semiconductor memory device having a plurality of level converters, each of said plurality of level converters comprising:
    a bridge circuit constituted by four MOS transistors having one type of conductivity, gates of one pair of said four transistors opposing each other receiving a first signal, gates of the other pair of said four transistors opposing each other receiving a signal complementary to said first signal;
    a pair of complementary MOS inverter circuits to which a second signal and a signal complementary to said second signal are input, respectively, the outputs of said pair of inverter circuits being connected to a first pair of connecting points positioned alternately in said bridge circuit, respectively; and
    a flip-flop circuit connected between a second pair of connecting points positioned alternately in said bridge circuit, to thereby output a third signal and a signal complementary to said third signal from said second pair of connecting points, respectively.

2. A semiconductor memory device according to claim 1, wherein said flip-flop circuit comprises a pair of MOS transistors having an opposite type of conductivity to that of said four transistors, gates of said pair of MOS transistors being connected to said second pair of connecting points, respectively.

3. A semiconductor memory device according to claim 1, further comprising a plurality of address buffer circuits each constituted by emitter coupled logic gates to which one of address bit signals and a reference signal are input, the potential levels of said first signal and said signal complementary to said first signal which are output from each of said address buffer circuits being changed in accordance with the potential level of the corresponding address bit signal.

4. A semiconductor memory device according to claim 3, further comprising a plurality of control circuits for controlling an inversion or non-inversion of the corresponding address bit signal, the potential levels of said second signal and said signal complementary to said second signal which are output from each of said control circuits being changed in accordance with data stored in the corresponding control circuit.

5. A semiconductor memory device according to claim 4, further comprising a decoder circuit, a standard memory cell array, a redundancy memory cell array, and a circuit for controlling a switch from said standard memory cell array to said redundancy memory cell array, wherein said third signal and said signal complementary to said third signal are supplied from each of said level converters to said decoder circuit, a portion of said standard memory cell array corresponding to predetermined address is selected through said decoder circuit in accordance with the potential levels of the third signals and the signals complementary to the corresponding third signal supplied from each of said level converters when at least one logic level of said input address bit signals does not coincide with that of said data stored in the corresponding control circuit, and said redundancy memory cell array is selected by said switching control circuit instead of said portion of the standard memory cell array when each logic level of said input address bit signals coincides with that of said data stored in the corresponding control circuit.

* * * * *